(12) United States Patent
Mutoh et al.

(10) Patent No.: US 6,207,983 B1
(45) Date of Patent: Mar. 27, 2001

(54) CHARGE TRANSFER DEVICE, AND DRIVING METHOD AND MANUFACTURING METHOD FOR THE SAME

(75) Inventors: Nobuhiko Mutoh; Takashi Nakano, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/488,318

(22) Filed: Jan. 20, 2000

(30) Foreign Application Priority Data

Jan. 22, 1999 (JP) .................................................. 11-014843

(51) Int. Cl.⁷ ........................ H01L 27/148; H01L 29/768; H01L 29/788
(52) U.S. Cl. ........................ 257/239; 257/238; 257/315; 257/316
(58) Field of Search .................................. 257/315, 316, 257/236, 238, 239

(56) References Cited

U.S. PATENT DOCUMENTS 4,684,800 * 8/1987 Morse et al. ........................ 250/211
5,491,354 * 2/1996 Hynecek ............................... 257/239
5,530,275 * 6/1996 Widdershoven ...................... 257/319

FOREIGN PATENT DOCUMENTS

| 63-13280 | 3/1988 | (JP) . |
| 5-152558 | 6/1993 | (JP) . |
| 7-22611 | 1/1995 | (JP) . |
| 7-106553 | 4/1995 | (JP) . |
| 11-40798 | 2/1999 | (JP) . |

OTHER PUBLICATIONS

Wen, David D., "Design and Operation of a Floating Gate Amplifier", IEEE Journal of Solid–State Circuits, vol. Sc–9, No. 6, pp. 410–414, 1974.
Ultra–high speed MOS Device, edited by Susumu Kohyama (Baifukan, p. 46, 1986).

* cited by examiner

Primary Examiner—Ngân V. Ngô
(74) Attorney, Agent, or Firm—Hutchins, Wheeler & Dittmar

(57) ABSTRACT

In a charge transfer device and a driving method therefor, electrons are injected through an insulating film into floating gate 108 or electrons are extracted through the insulating film from the floating gate 108, whereby the potential of the floating gate is converged to a fixed voltage.

8 Claims, 8 Drawing Sheets

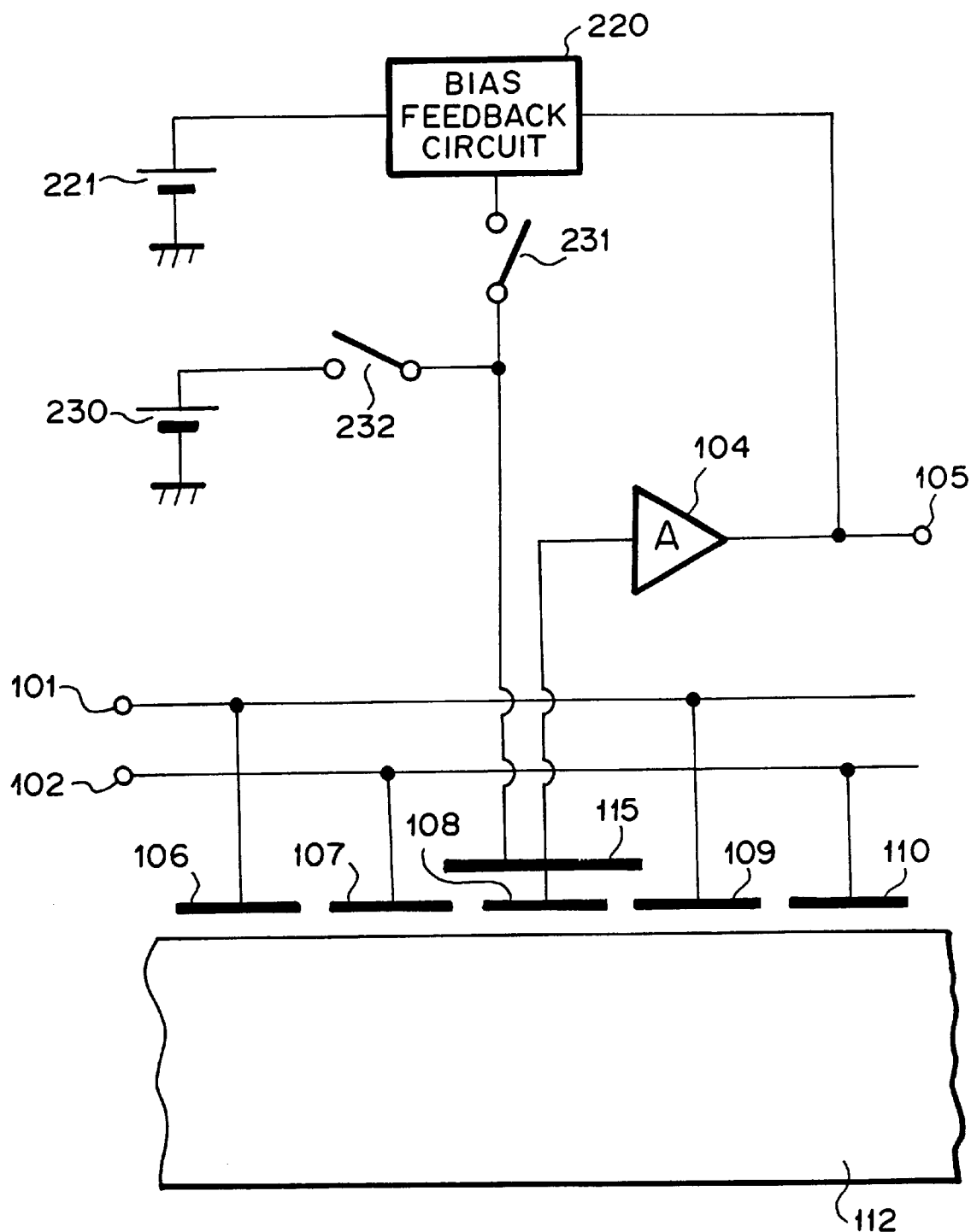
F I G. 5

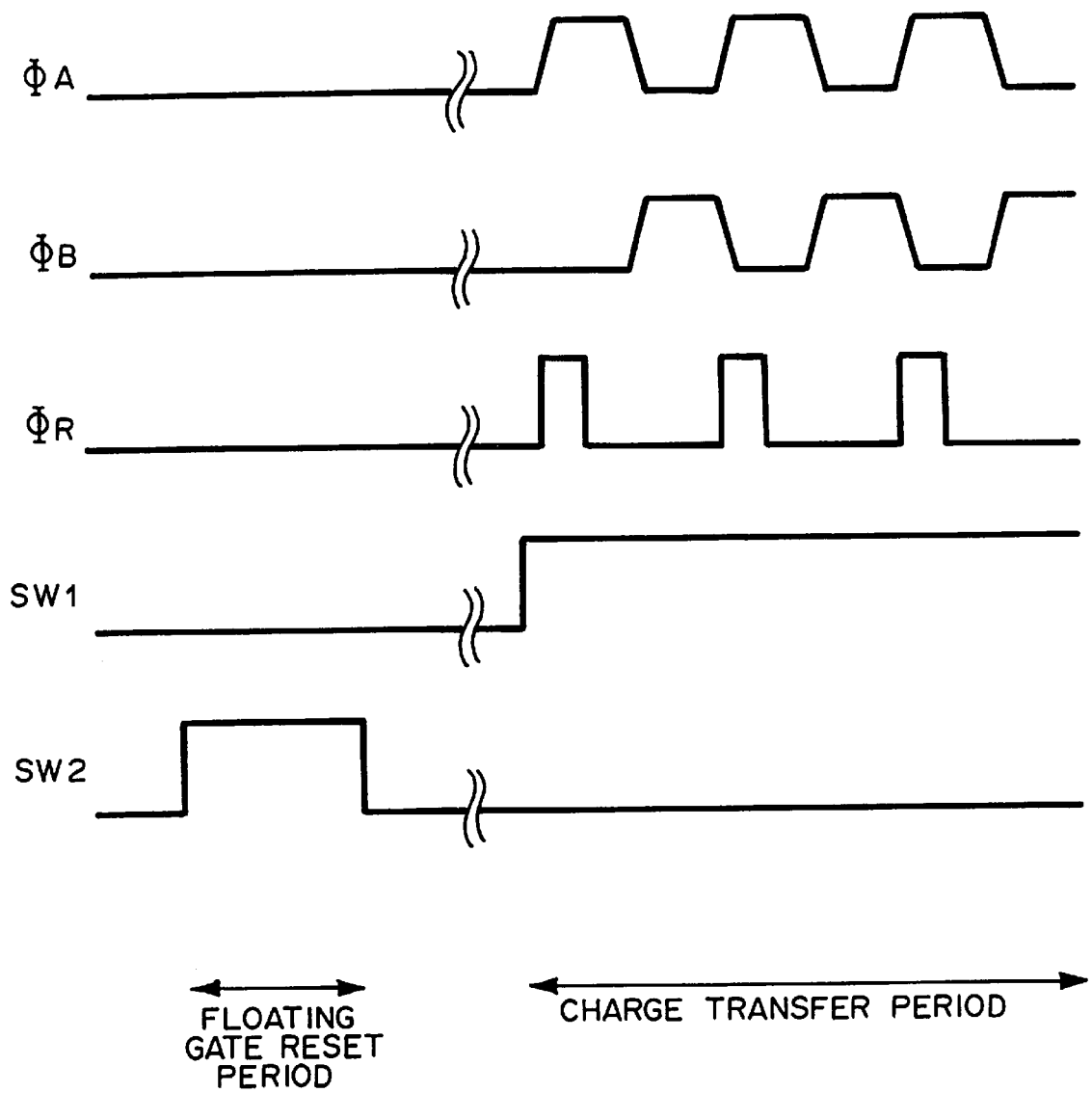

CHARGE TRANSFER DEVICE, AND DRIVING METHOD AND MANUFACTURING METHOD FOR THE SAME

BACKGROUND OF THE INVENTION

1. Field of the Invention

The present invention relates to a charge transfer device, and a driving method and a manufacturing method for the charge transfer device and particularly, to a floating gate type-charge detector applied to the output portion of a charge transfer device and a driving method and a manufacturing method for the charge transfer device.

2. Description of the Prior Art

A floating diffusion type-charge detector and a floating gate type-charge detector are generally known as a charge detector which is applied to the output portion of a charge transfer device.

In the case of the floating diffusion type-charge detector, signal charge to be detected is accumulated in a floating diffusion layer provided at the output portion of the detector, and the potential variation of the floating diffusion layer due to the accumulation of the signal charge is amplified by a buffer amplifier which is generally provided in a chip, and then output to the outside.

In the case of the floating gate type-charge detector, the signal charge to be detected is accumulated in a transfer channel below a floating gate provided at the output portion of the detector, and the potential variation which is induced in the floating gate through the coupling capacitance between the transfer channel and floating gate is amplified by a buffer amplifier, and then output to the outside.

In the floating diffusion type-charge detector, the conversion efficiency for conversion of the signal charge to the output voltage can be set to a higher value as compared with the floating gate type-charge detector by reducing the capacitance of the floating diffusion layer. However, it carries out a so-called destructive detection in which signal charge cannot be reproduced once it detects the signal charge, and it has a disadvantage that there occurs a noise which is so-called reset noise.

On the other hand, as compared with the floating diffusion type-charge detector, the floating gate type-charge detector has generally lower conversion efficiency for conversion of the signal charge to the output voltage, however, the signal charge can be non-destructively detected, and at this time occurrence of the reset noise can be prevented.

The floating gate type-charge detector is divided into two types. In one type of floating gate type-charge detector, when a charge transfer element to which this floating gate type-charge device is applied is driven, a bias gate is provided above the floating gate to control the operating point of the floating gate. In the other type of floating gate type-charge detector, a preset transistor for resetting the potential of the floating gate to a reference potential before the charge detection is provided.

FIG. 1 is a schematic diagram showing a conventional floating gate type-charge detector as disclosed in Japanese Laid-open Patent Publication No. 57-27497, and a bias gate is provided above a floating gate. A charge detector shown in FIG. 1 includes terminals 301 and 302 for supplying a driving voltage, transfer electrodes 306, 307, 309 and 310 for a charge transfer element, floating gate 308, output amplifier 304, wire 303 connecting the floating gate 308 and the output amplifier 304 to each other, DC bias gate 315, terminal 314 for applying a DC voltage to the DC bias gate 315, amplifier output terminal 305 of the output amplifier 304, insulating film 311 and semiconductor substrate 312. The transfer electrodes 306 and 309 are connected to the terminal 301, and the transfer electrodes 307 and 310 are connected to the terminal 302.

The charge detector shown in FIG. 1 is operated in a (2+½)-phase driving mode by driving pulses ΦA and ΦB shown FIG. 2. The three electrodes 306, 307 and 308 constitute one row of the charge transfer element. The terminals 301 and 302 are supplied with the pulses ΦA and ΦB which are shifted in phase by 120°, and a suitable DC voltage VC is applied through the terminal 314 to the bias gate 315 so that the offset level of the floating gate 308 is adjusted and set to about a half of the pulse voltage of the pulses ΦA and ΦB.

The transfer of the signal charge is carried out as follows. That is, when signal charge 313 is transferred and located below the floating gate 308, the voltage which is substantially proportional to the amount of the signal charge 313 is induced at the floating gate 308 through the coupling capacitance between a transfer channel and the floating gate 308, and the voltage thus induced is output as an output voltage through the output amplifier 305 to the outside. At this time, the signal charge 313 is kept below the floating gate 308 without being extinguished, and also it is allowed to be transferred to the adjacent electrode. Therefore, this charge detection method is a so-called non-destructive detection method.

The floating gate type-charge detector is also disclosed in Japanese Laid-open patent Publication No. 5-152558.

With respect to such a floating gate type-charge detector that a bias gate is provided above a floating gate, there is know such a structure that a bias feedback circuit is installed in order to reduce parasitic capacitance of the floating gate and enhance the conversion efficiency for conversion of the signal charge to the output voltage.

FIG. 3 shows a conventional floating gate type-charge detector disclosed in Japanese Laid-open Patent Publication No. 11-040798, and a bias gate and a bias feedback circuit are provided. In the charge detector shown in FIG. 3, N-type buried channel 417 is formed in P-type well 416 on N-type semiconductor substrate 412. Insulating film 411 is formed on the N-type buried channel 417, and transfer electrodes 406B, 406S, 407B, 407S, 409B, 409S, 410B and 410S for the charge transfer element is formed on the insulating film 411. Further, N⁻ region 418 for forming a potential barrier is provided in the N-type channel 417 below the specific transfer electrodes 406B, 407B, 409B and 410B, thereby implementing a two-phase driving operation. Output gate 419 and floating gate 408 are provided between the transfer gates 407 and 409, and bias gate 415 is provided on insulating film 411 formed on the floating gate 408. The potential variation of the floating gate 408 is passed through buffer amplifier 404 and then output from output terminal 405 to the outside. Further, bias feedback circuit 420 comprising capacitance element 422 and resistance element 423 which are series-connected to each other is provided, and the connection point between the capacitance element 422 and the resistance element 423 is further connected to the bias gate 415.

In the case of the floating gate type-charge detector in which the bias gate is provided above the floating gate as described above, in other words, in the case of the floating gate type-charge detector in which no preset transistor is provided, the electrical operating point of the floating gate is varied in proportion to the charge amount when the floating gate is charged by some cause during the manufacturing process of a charge transfer device to which the above charge detector is applied or at the stage that it is used after the manufacturing.

The bias gate or both of the bias gate and the bias feedback circuit are originally provided to control the operating point of the floating gate. However, when the charge amount is excessively increased, the operating point of the floating gate cannot be sufficiently controlled by only the effect of the capacitance coupling between the bias gate and the floating gate, and consequently the signal charge cannot be detected or the conversion efficiency of converting the signal charge to the output voltage is extremely lowered. Even when the charge amount is not excessively large, it is required to correct the voltage to be applied to the bias gate every individual charge detector if the charge amount is dispersed among a plurality of charge detectors manufactured, and thus the number of parts of a driving device is increased.

In order to avoid the disadvantages described above, some charge preventing countermeasure should be originally taken. However, it is usually difficult to prevent those disadvantages for charge during the manufacturing process, particularly during the wafer diffusion process.

SUMMARY OF THE INVENTION

An object of the present invention is to provide a charge transfer device having a floating gate type-charge detector which can eliminate an effect of charge when a floating gate is charged by some cause in a floating gate type-charge detector which is provided with a bias gate and no preset transistor, and a driving method and a manufacturing method for the charge transfer device.

In order to attain the above object, according to a first aspect of the present invention, there is provided a charge transfer device provided with a charge detection portion which comprises: a floating gate, means for detecting the potential variation of the floating gate, and means for injecting electrons through an insulating film into the floating gate or means for extracting electrons through an insulating film from the floating gate.

According to a second aspect of the present invention, a charge transfer device provided with a charge detection portion which comprises: a floating gate; means for detecting the potential variation of the floating gate; a bias gate which covers at least a part of the floating gate; and voltage applying means for applying a first voltage to the bias gate to make the floating gate hold the DC bias voltage as an offset level, and applying a second voltage to the bias gate to inject electrons through an insulating film into the floating gate or extract electrons through an insulating film from the floating gate.

According to a third aspect of the present invention, a charge transfer device provided with a charge detection portion which comprises: a floating gate; a buffer amplifier for detecting the potential variation of the floating gate; a bias gate which covers at least a part of the floating gate; a bias feedback circuit for adding the AC component output of the buffer amplifier to a first DC voltage and applying the addition result to the bias gate for a charge detection period; voltage applying means for applying a second DC voltage to the bias gate to inject electrons through an insulating film into the floating gate or extract electrons through an insulating film from the floating gate in a floating gate reset period which is set to be out of the charge detection period.

According to a fourth aspect of the present invention, a driving method for a charge transfer device which comprises: detecting the potential variation of a floating gate in a charge detection portion, and controlling the potential of the floating gate by injecting electrons through an insulating film into the floating gate or extracting electrons through an insulating film from the floating gate.

According to a fifth aspect of the present invention, a driving method for a charge transfer device which comprises: detecting the potential variation of a floating gate in a charge detection portion, applying a voltage to the bias gate which covers at least a part of the floating gate to inject electrons through an insulating film into the floating gate or extract electrons through an insulating film from the floating gate, thereby controlling the potential of the floating gate.

According to a sixth aspect of the present invention, a driving method for a charge transfer device which comprises: detecting the potential variation of the floating gate in a charge detection portion, applying a first voltage to the bias gate which covers at least a part of the floating gate to make the floating gate hold the DC bias voltage as an offset level, applying a second voltage different from the first voltage to the bias gate to inject electrons through an insulating film into the floating gate or extract electrons through an insulating film from the floating gate, thereby controlling the potential of the floating gate.

In the driving method for the charge transfer device, it is preferable that the injection/extraction of the electrons into/ from the floating gate is performed by using the tunnel effect.

According to a seventh aspect of the present invention, a driving method for a charge transfer device which comprises: detecting the potential variation of a floating gate by a buffer amplifier, adding the AC component output of the buffer amplifier to a first DC voltage and thereafter applying the addition result to the bias gate which covers at least a part of the floating gate for a charge detection period, applying a second DC voltage to the bias gate in a floating gate reset period which is set to be out of the charge detection period and thereby injecting electrons through an insulating film into the floating gate or extracting electrons through an insulating film from the floating gate.

According to an eighth aspect of the present invention, a manufacturing method for a charge transfer device which comprises: forming a floating gate from which the potential variation is detected, and injecting electrons through an insulating film into the floating gate or extracting electrons through an insulating film from the floating gate, thereby controlling the charge amount of the floating gate.

BRIEF DESCRIPTION OF THE DRAWINGS

FIG. 5 is a diagram showing a second preferred mode of a charge transfer device according to the present invention;

FIG. 9 is a timing chart showing a driving pulse in another embodiment of a driving method for the charge transfer device according to the present invention.

DETAILED DESCRIPTION OF THE PREFERRED EMBODIMENTS

First, preferred modes according to the present invention will be described with reference to the accompanying drawings.

Figure 1:
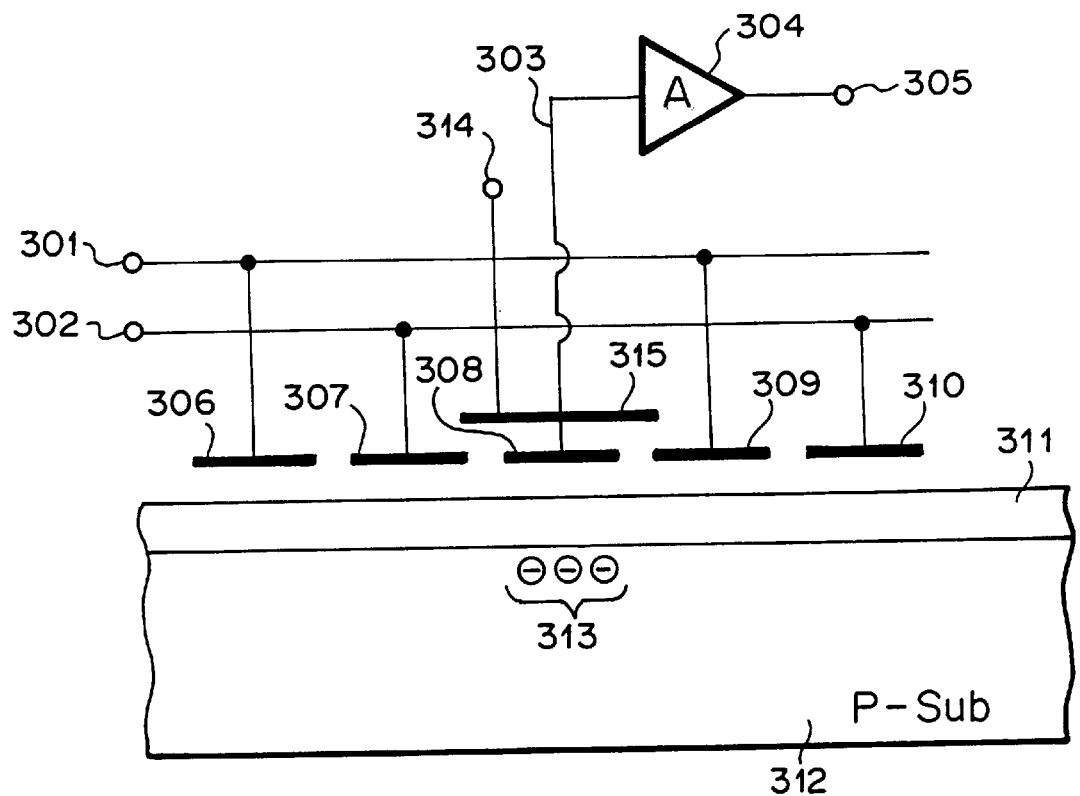
FIG. 1 is a diagram showing a conventional charge transfer device.
Figure 2:
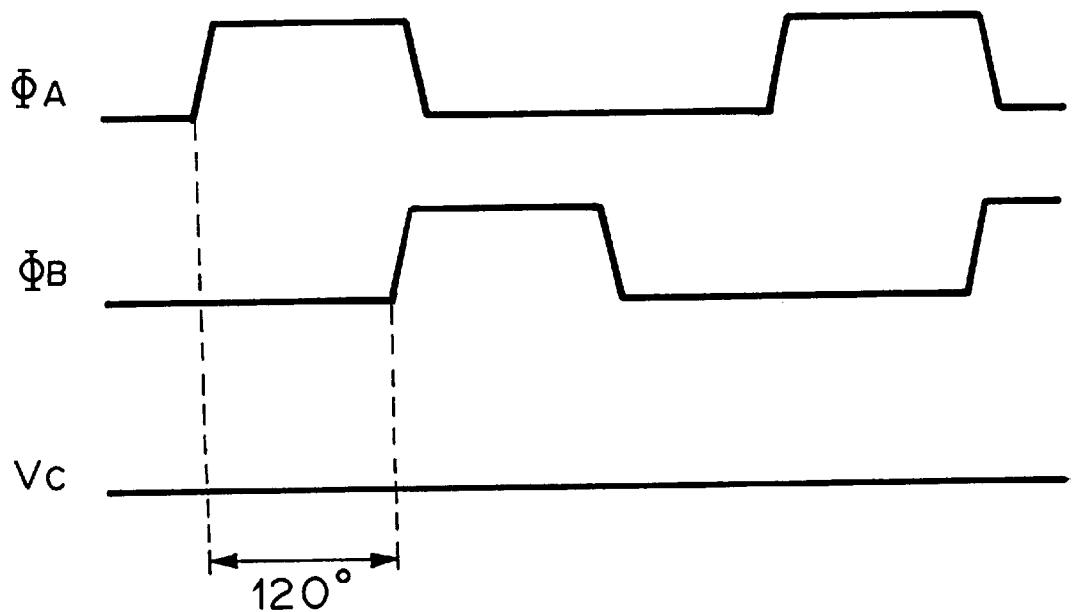
FIG. 2 is a timing chart showing the driving of the conventional charge transfer device.
Figure 3:
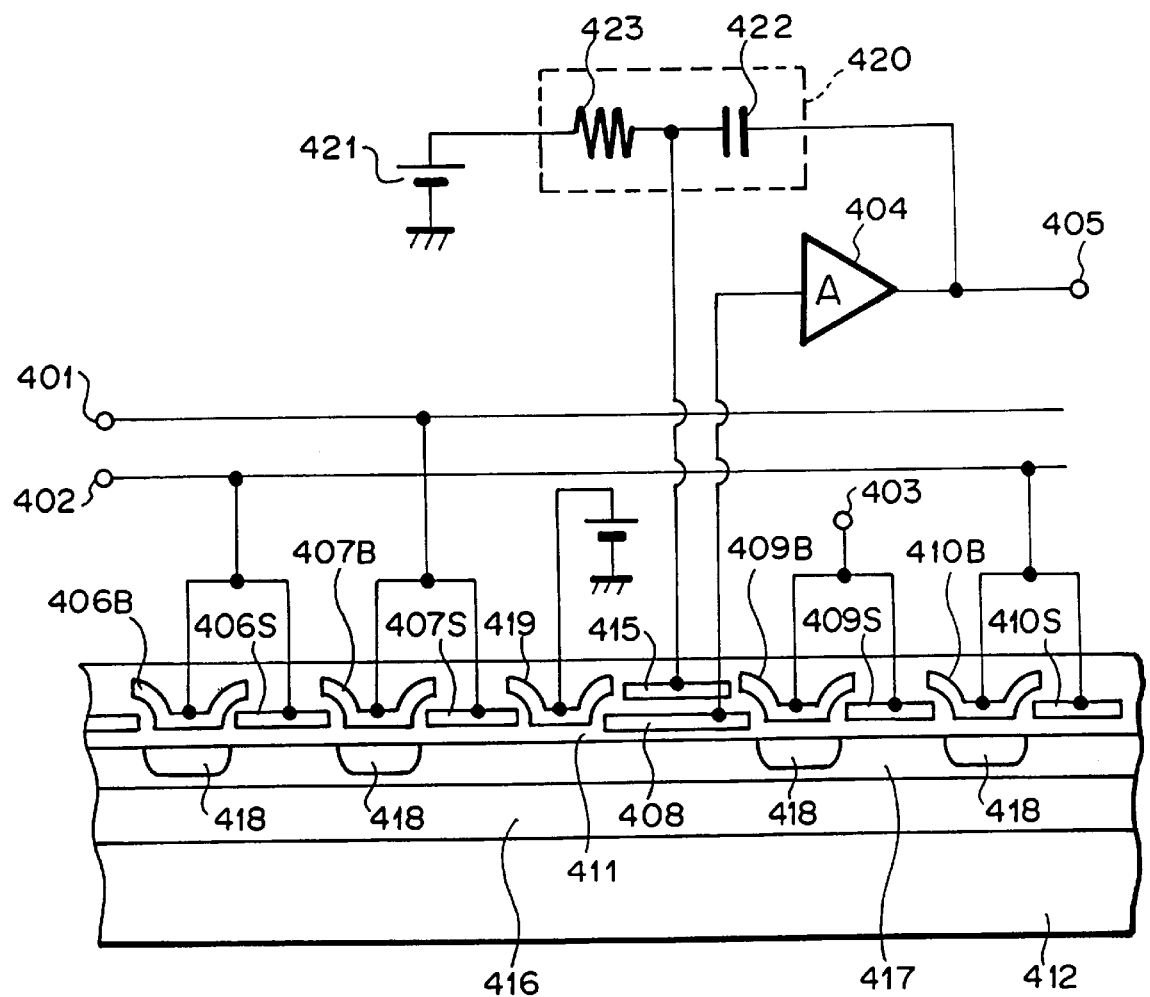
FIG. 3 is a diagram showing another conventional charge transfer device.
Figure 4:
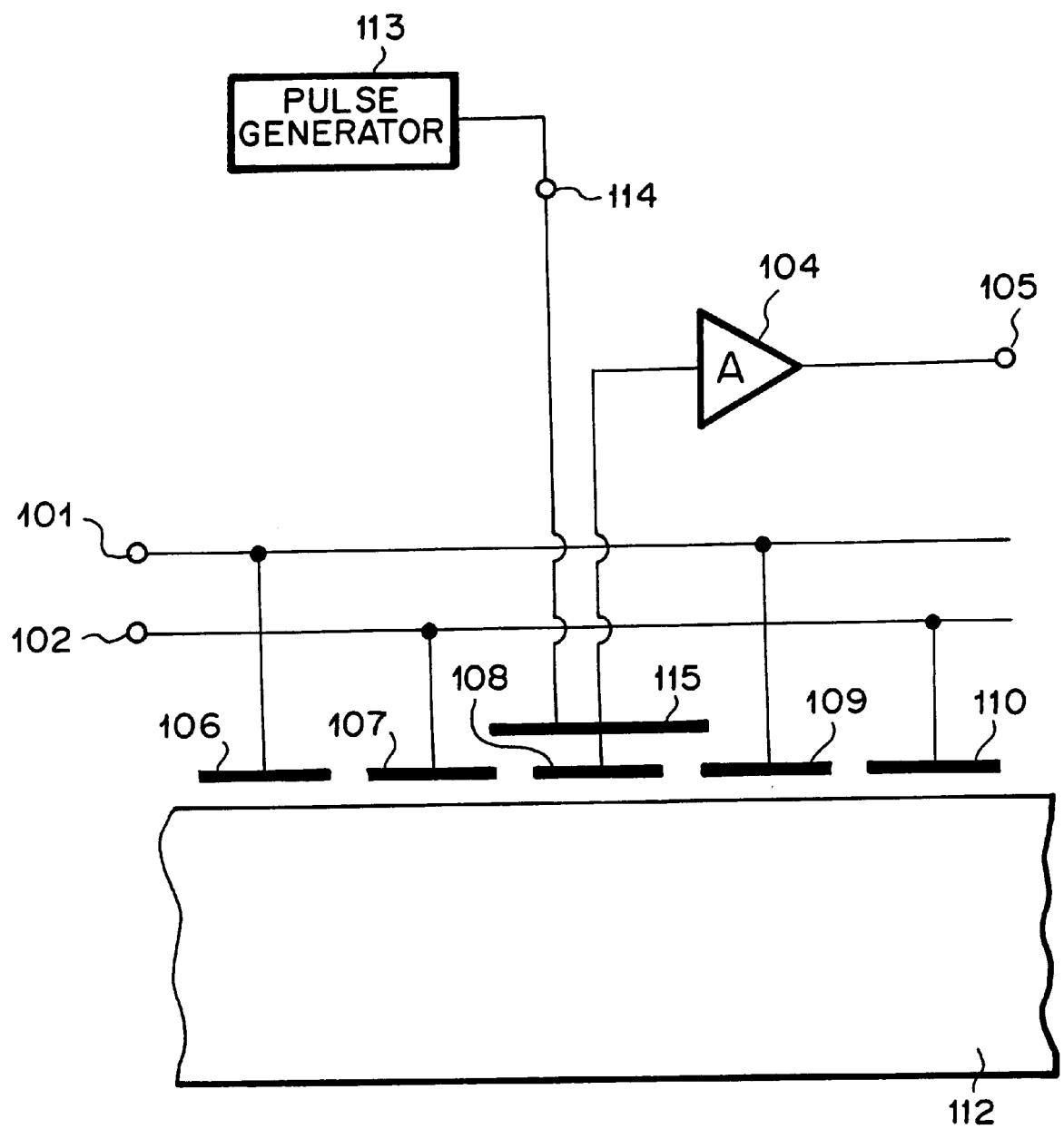
FIG. 4 is a diagram showing a first preferred mode of a charge transfer device according to the present invention.

FIG. 4 shows a first preferred mode of a charge transfer device according to the present invention.

A charge transfer device having a floating gate type-charge detector shown in FIG. 4 includes, on semiconductor substrate 112, transfer electrodes 106, 107, 109 and 110 of a charge transfer element, floating gate 108 provided between the transfer electrode 107 and the transfer electrode 109, buffer amplifier 104, wire 103 for connecting the floating gate 108 and the buffer amplifier 104, output terminal 105 of the buffer amplifier 104 and terminal 114 for supplying a bias voltage to bias gate 115.

A suitable voltage is applied to the terminal 114 by pulse generator 113 so that tunnel current flows through at least one of the insulating film between the semiconductor substrate 112 and floating gate 108 and the insulating film between the floating gate 108 and bias gate 115. As a result, the potential of the floating gate 108 is converged to a fixed voltage value. Accordingly, even when the floating gate is charged by some cause, the charge can be removed.

FIG. 5 shows a second preferred mode of the charge transfer device according to the present invention. In addition to the construction of the charge transfer device shown in FIG. 4, the charge transfer device of this mode includes bias feedback circuit 220 connected to the output terminal 105, first DC voltage source 221 connected to the bias feedback circuit 220, first switch 231 provided between the bias gate 115 and the bias feedback circuit 220, second DC voltage source 230, and second switch 232 provided between the bias gate 115 and the second DC voltage source 230.

The bias feedback circuit 220 functions to convert the DC bias level of the output of the buffer amplifier 104 to the voltage given by the first DC voltage source 221 (that is, adding the AC component output of the buffer amplifier 104 with the voltage given by the first DC voltage source 221), and apply the voltage thus converted to the bias gate 115 during a charge transfer period for which the first switch 231 is turned on. In this mode, the bias feedback circuit 220 is designed in an on-chip style, however, it may be designed in an off-chip style, that is, it may be formed out of a chip. Further, in this mode, the first switch 231 and the second switch 232 are designed in the on-chip style, however, they may be designed in the off-chip style. The bias source 221 shown in FIG. 5 is a positive voltage source, however, it may be a negative voltage source if necessary.

During the charge transfer period for which the signal charge is actually detected, assuming that the first switch 231 is turned on, the positive feedback signal of the potential of the floating gate 108 is superposed on the potential of the bias gate 115, and the potential of the bias gate 115 and the potential of the floating gate 108 are varied in phase, so that the capacitance between the floating gate 108 and the bias gate 115 does not act as parasitic capacitance of the floating gate 108. Therefore, the parasitic capacitance of the floating gate 108 can be reduced and thus the charge detection sensitivity can be enhanced.

In this mode, the voltage of the second DC voltage source 230 is also applied to the bias gate 115 by setting the second switch 232 to an ON-state and setting the first switch 232 to an OFF-state, and the potential of the floating gate 108 is converged to a fixed voltage value as in the case of the first preferred mode. Accordingly, even when the floating gate 108 is charged by some cause, the charge can be removed.

Usually, the voltage to be applied to the bias gate is generally set to about 15V as shown in FIG. 4 of the reference (David D. Wen, "Design and Operation of a Floating Gate Amplifier", IEEE Journal of Solid-State Circuits, vol. Sc-9, no.6, pp. 410–414, 1974). In this case, the intensity of the electric field in the insulating film is about $1\times10^5$V/cm, and generally this electric field intensity is equal to 1 to $2\times10^6$V/cm or less.

In the present invention, when electrons are injected through an insulating film into the floating gate or electrons are extracted through an insulating film from the floating gate, the intensity of the electric field in the insulating film is set to be larger than 1 to $2\times10^6$V/cm, and any voltage value may be set insofar as it enables the tunnel effect. The upper limit of the intensity of the electric field is the electric field intensity which induces breakdown. In the present invention, the more desirable intensity of electric field is set to about 5 to $7\times10^6$V/cm in consideration of the dispersion of elements in the manufacturing process, and this electric field intensity can be achieved by application of 50 to 80V in the following embodiment.

In "Ultra-high speed MOS device" edited by Susumu Kohyama (Baifukan, p 46, issued in 1986), it is described that FN (Fowler-Nordheim) tunnel current starts to flow when the intensity of electric field of the silicon oxide film is above $5\times10^6$V/cm.

[EMBODIMENTS]

Next, preferred embodiments according to the present invention will be described hereunder in details with reference to the accompanying drawings.

Figure 6:
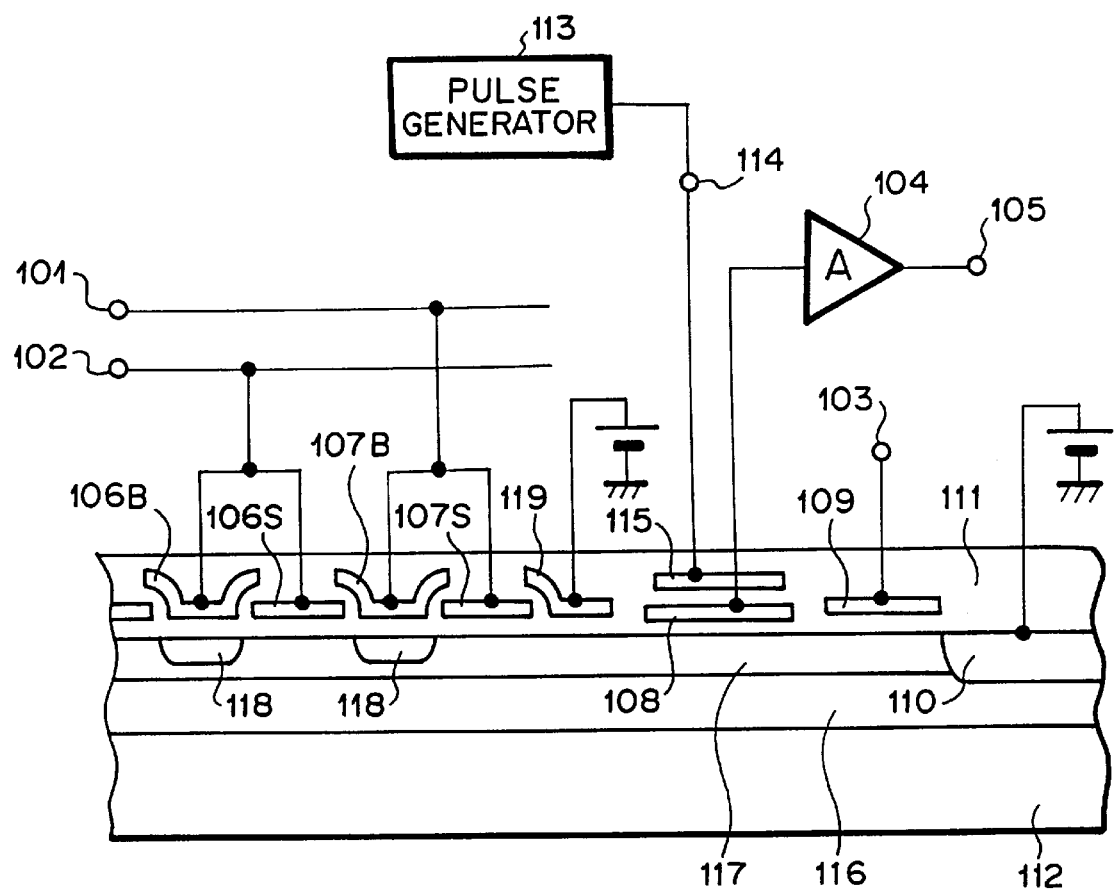
FIG. 6 is a connection diagram showing a first embodiment of the charge transfer device according to the present invention.

FIG. 6 shows a first embodiment of the charge transfer device according to the present invention.

In a charge transfer device having a floating gate type-charge detector shown in FIG. 6, N-type buried channel 117 is formed in P-type well 116 on N-type semiconductor substrate 112. Insulating film 111 is formed on the N-type buried channel 117, and transfer electrodes 106B, 106S, 107B, 107S of a charge transfer element are provided on the insulating film 111. Further, $N^{31}$ regions 118 for forming potential barriers are provided in the N-type buried channel 117 below the specific transfer electrodes 106B, 107B respectively, and the charge transfer direction can be regulated to one direction by the potential barriers, which enables the two-phase driving operation. Terminals 101 and 102 supply two-phase driving pulse voltages to the transfer electrodes 107B and 107S and the transfer electrodes 106B and 106S, respectively.

Subsequently to the transfer electrode 107S are provided output gate 119, floating gate 108, reset gate 109 and reset drain 110. Bias gate 115 is provided on insulating film 111 formed on the floating gate 108. Terminals 103, 114 supply the driving voltages to the reset gate 109 and the bias gate 115 respectively. Pulse generator 113 apply a suitable pulse voltage to the terminal 114. The potential variation of the floating gate 108 is passed through buffer amplifier 104 and then output to the outside from output terminal 105. The buffer amplifier 104 and the output terminal 105 constitute the means for detecting the potential variation of the floating gate 108. In this embodiment, the reset gate 109 is provided so as to be adjacent to the floating gate 108 unlike the first preferred mode described above. However, the transfer electrode may be provided so as to adjacent to the floating gate 108 like the first preferred mode.

As not shown, the P-type well 116 is connected to an channel stopper region for partitioning a charge transfer passage containing the N-type buried channel 117 and the reset drain 110, and a reference potential (0V) is applied to the P-type well 116 as well as the channel stopper region.

The impurity concentration of the N-type semiconductor substrate 112 is set in the range from about $1 \times 10^{14}$ to $5 \times 10^{14}/cm^3$, the junction depth of the P-type well 116 is set in the range from about 2 to 3 $\mu$m, the impurity concentration of the P-type well 116 is set in the range from about $1 \times 10^{15}$ to $1 \times 10^{16}/cm^3$, the junction depth of the N-type buried channel 117 is set in the range from about 0.3 to 0.5 $\mu$m, and the impurity concentration of the N-type buried channel 117 is set in the range from about $5 \times 10^{16}$ to $1 \times 10^{17}/cm^3$. The transfer electrodes 106S, 107S, the floating gate 108 and the reset gate 109 are formed of polysilicon of a first layer, and the transfer electrodes 106B, 107B, the output gate 119 and the bias gate 115 are formed of polysilicon of a second layer. The electrode length of each of the transfer electrodes 106S, 107S, 106B, 107B is set in the range from about 2 to 5 $\mu$m, the electrode length of the floating gate 108 is set in the range from about 5 to 10 $\mu$m, the electrode length of the reset gate 109 is set in the range from about 3 to 5 $\mu$m, and the film thickness of each of the transfer electrodes 106S, 107S, 106B, 107B, the floating gate 108, the reset gate 109 and the bias gate 115 is set in the range from about 200 to 400 nm. The insulating film between the semiconductor substrate 112 and each of the transfer electrodes 106S, 107S, 106B, 107B and the insulating film between the semiconductor substrate 112 and the reset gate 109 are formed of a silicon oxide film, and the film thickness thereof is set in the range from 50 nm to 100 nm. The insulating film between the semiconductor substrate 112 and the floating gate 108 is also formed of a silicon oxide film. However, the film thickness thereof is set in the range from 10 to 50 nm, and it is smaller than the film thickness between the semiconductor substrate 112 and each of the transfer electrodes 106S, 107S, 106B, 107B. One reason why the film thickness is made smaller resides in that the coupling capacitance between the semiconductor substrate 112 and the floating gate 108 is increased to enhance the conversion efficiency of converting the signal charge to the output voltage. Further, the insulating film between the floating gate 108 and the bias gate 115 is also formed of a silicon oxide film, and the film thickness thereof is set in the range from 100 to 150 nm. The other reason why the film thickness of the silicon oxide film between the semiconductor substrate 112 and the floating gate 108 is made smaller than the film thickness between the semiconductor substrate 112 and the transfer electrode is as follows. The DC voltage is applied to the bias gate 115 in the floating gate reset period, and at this time, the electric field in the insulating film between the semiconductor substrate 112 and floating gate 108 and the insulating film between the floating gate 108 and bias gate 115 is intensified, thereby making the tunnel current flow more smoothly.

In this embodiment, the output gate 119 and the floating gate 108 are not overlapped with each other in the cross-sectional view of FIG. 6. Further, the floating gate 108 and the reset gate 109 are not overlapped with each other. A gap of about 0.5 $\mu$m exists between the non-overlapped gates.

The buffer amplifier 104 for detecting the potential variation of the floating gate 108 is constructed by a source follower amplifier, and the voltage amplification factor is set to about 0.7 to 0.8.

Figure 7:
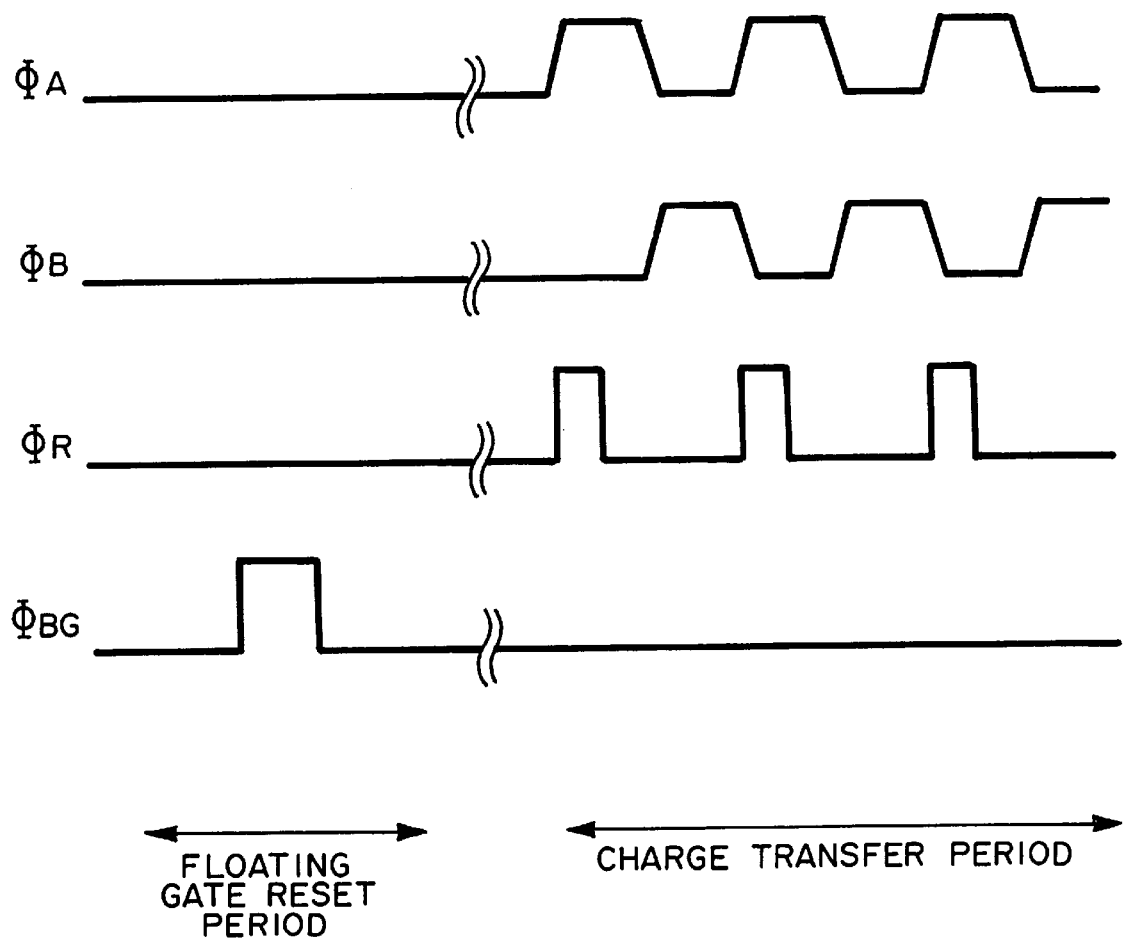
FIG. 7 is a timing chart showing a driving pulse according to an embodiment of a driving method for a charge transfer device according to the present invention.

FIG. 7 is a timing chart showing driving pulses according to a driving method of the present invention. The driving pulses ΦA, ΦB, ΦR, ΦBG are applied to the terminals 101, 102, 103, 114 respectively, and a reset drain voltage VRD which is a constant voltage is applied to the reset drain 110. During the floating gate reset period, the driving pulses ΦA, ΦB, ΦR are stopped, and only the driving pulse ΦBG has a positive pulse voltage. When the positive pulse voltage of the driving pulse ΦBG is applied to the terminal 114, charge delivery is performed between the N-type buried channel 117 and floating gate 108 or between the floating gate 108 and bias gate 115, or both between the N-type buried channel 117 and floating gate 108 and between the floating gate 108 and bias gate 115, and as a result the potential of the floating gate 108 can be converged to some voltage irrespective of the charge amount of the floating gate 108 before the floating gate reset period. During the charge transfer period, the driving pulse ΦBG is stopped, and a positive pulse voltage is applied to driving pulses ΦA, ΦB, ΦR. The driving pulses ΦA and ΦB are two-phase driving pulses, and the driving pulse ΦR is a pulse for resetting the potential of the N-type buried channel 117 below the floating gate 108 to the reset drain voltage VRD.

The above driving pulses are set as follows. That is, during the floating gate reset period, the voltage value of the low level of the driving pulse ΦBG is set to 0V, the voltage of the high level thereof is set to 50 to 80V, and the pulse width thereof is set to 1 to 5 $\mu$sec. All the voltage values of the driving pulses ΦA, ΦB, ΦR, ΦRD are set to 0V, and 0V is applied to both the N-type semiconductor substrate 112 and the P-type well 116. When the driving pulse ΦBG is increased from the low level to the high level, the intensity of the electric field in the silicon oxide film between the N-type buried channel 117 and floating gate 108 and in the silicon oxide film between the floating gate 108 and bias gate 115 is increased and tunnel current flows in both the insulating films, so that current flows between the N-type buried channel 117 and the bias gate 115.

If the floating gate 108 before the application of the driving pulse ΦBG is positively charged, the intensity of the electric field in the silicon oxide film between the N-type buried channel 117 and floating gate 108 is larger than the intensity of the electric field in the silicon oxide film between the floating gate 108 and bias gate 115 when the driving pulse ΦBG rises up to high level, so that the tunnel current is more liable to flow between the N-type buried channel 117 and the floating gate 108 preferentially. Conversely, if the floating gate 108 before the application of the driving pulse ΦBG is negatively charged, the intensity of the electric field in the silicon oxide film between the floating gate 108 and bias gate 115 is larger than the intensity of the electric field in the silicon oxide film between the N-type buried channel 117 and bias gate 115 when the driving pulse ΦBG rises up to high level, so that the tunnel current is more liable to flow between the floating gate 108 and the bias gate 115 preferentially. After the tunnel current starts to flow, the potential of the floating gate 108 is varied so that the intensities of the electric fields in both the insulating films are equal to each other, and the tunnel current flows through both the insulating films.

During the period for which the driving pulse ΦBG is kept at high level, the potential of the floating gate 108 is converged to a fixed voltage value as the current flows between the N-type buried channel 117 and bias gate 115 and approaches to a stationary state. This voltage value is uniquely determined by the resistance values of both the insulating films and the high-level voltage value applied to the bias gate 115 in the stationary state that the tunnel current as described above flows. The convergence of the potential of the floating gate 108 to the fixed voltage value means that the charges charged in the floating gate 108 have been discharged. Thereafter, the driving pulse ΦBG is varied from the high level to the low level, and the reset of the floating gate 108 is completed.

In this embodiment, it is shown that during the period in which the driving pulse ΦBG is kept in the high level, the tunnel current finally flows in both the insulating films of the silicon oxide film between the N-buried buried channel 117 and floating gate 108 and the silicon oxide film between the floating gate 108 and the bias gate 115, thereby achieving the stationary state. However, even under the condition that the tunnel current flows in only one of the insulating films, the reset of the floating gate 108 is possible. However, the floating gate 108 can be more stably reset in this embodiment like the case where the tunnel current flows in both the insulating films to establish the stationary state. Consequently, the potential dispersion of the floating gate 108 can be more small.

The driving pulses ΦA and ΦB in the charge transfer period of FIG. 7 are set as complementary pulses which are different by 180° in phase. Each amplitude of the driving pulses ΦA and ΦB is equal to 5V and each duty (impulse ratio) of the driving pulses ΦA and ΦB is equal to 50%. The amplitude of the driving pulse ΦR is equal to 5V and the reset drain voltage VRD is equal to 15V. When the driving pulse ΦR is in high level, the reset gate is opened and the potential of the N-type buried channel 117 below the floating gate 108 is reset to the reset drain voltage VRD (15V). Thereafter, the driving pulse ΦA is varied from the high level to the low level and the signal charge accumulated in the N-type buried channel 117 below the electrode 107S is transferred to the N-type buried channel 117 below the floating gate 108 in accordance with the variation of the driving pulse ΦA. A predetermined DC voltage is applied to the output gate 119. This voltage is set to such a suitable value that a potential barrier required to accumulate the signal charge below the electrode 107S is formed at the output gate 119 when the driving pulse ΦA is in high level, and that a potential barrier which disturbs the transfer of the signal charge from the position below the electrode 107S to the position below the floating gate 108 is not formed when the driving pulse ΦA is in low level.

The driving pulse ΦBG is stopped during the charge transfer period, and a DC voltage is applied to the bias gate 115 through the terminal 114. This voltage is set to such a suitable value that the channel potential below the floating gate 108 is deeper than at least the channel potential below the output gate 119 so that the signal charge can be accumulated in the region of the N-type buried channel 117 below the floating gate 108 when the signal charge is transferred from the position below the electrode 107S to the position below the floating gate 108.

Figure 8:
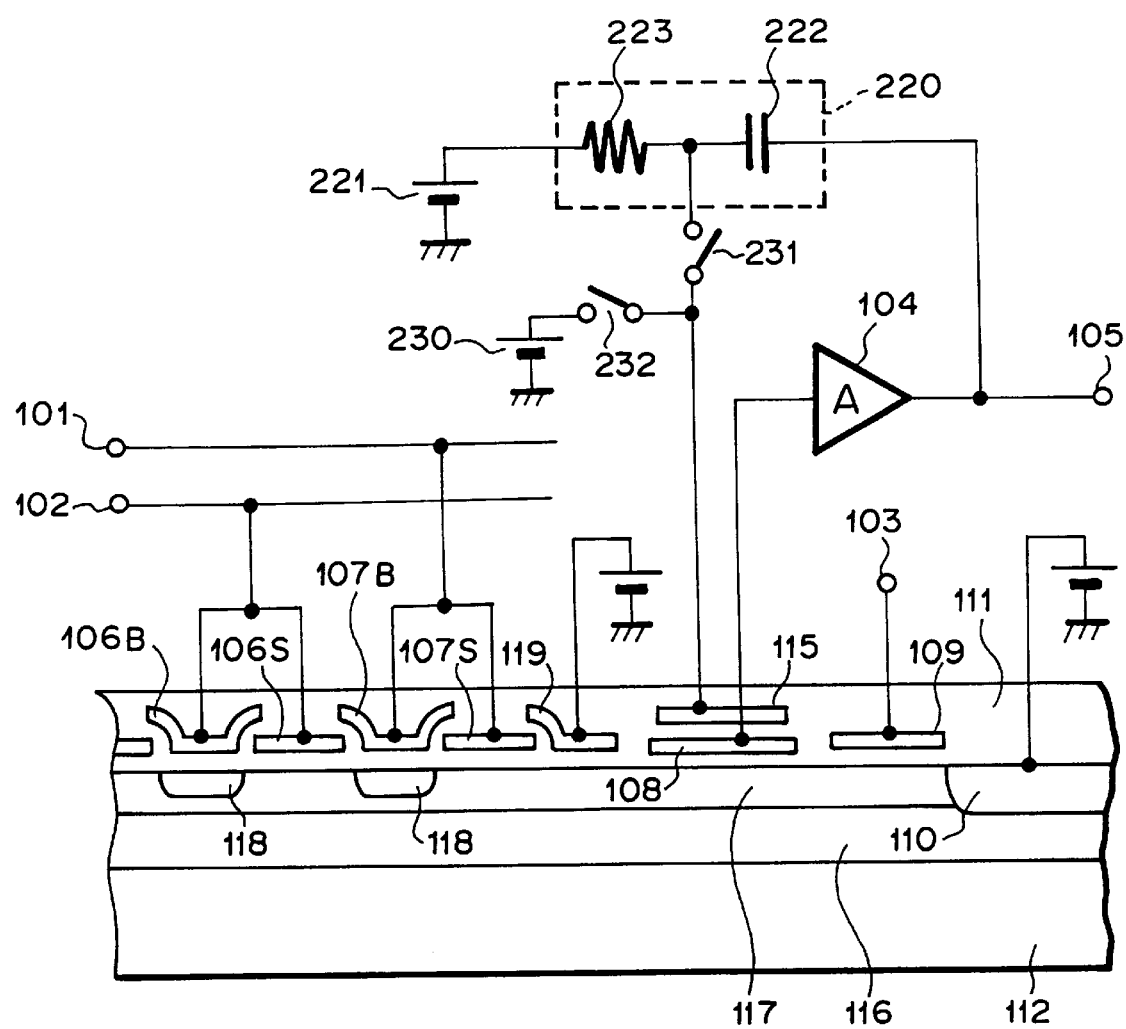
FIG. 8 is a connection diagram showing a second embodiment of the charge transfer device according to the present invention.

Next, a second embodiment according to the present invention will be described in detail with reference to FIG. 8.

The charge transfer device of this embodiment has the following construction in addition to the construction of the charge transfer device shown in FIG. 6. That is, bias feedback circuit 220 comprising capacitance element 222 and resistance element 223 which are connected in series is provided between the buffer amplifier 104 and first DC voltage source 221, and the connection point between the capacitance element 222 and resistance element 223 is connected to the bias gate 115 through first switch 231. Further, second DC voltage source 230 is connected to the bias gate 115 through second switch 232.

The buffer amplifier 104 for detecting the potential variation of the floating gate 108 is composed of a source follower amplifier, and the voltage amplification factor is set to about 0.7 to 0.8. The capacitance C of the capacitance element 222 and the resistance R of the resistance element 223 are set so that the CR time constant defined by the product of the capacitance C and the resistance R is equal to about several times or more of the clock period of the charge transfer device. Specifically, the capacitance C is set to about 5 pF and the resistance R is set to about 1MΩ for a charge transfer device which operates at a frequency of 10 MHz, that is, at a clock period of 100 nsec.

With the above setting, the bias feedback circuit 220 has a function of converting the DC bias level of the output of the buffer amplifier 104 to the voltage given by the first DC voltage source 221, and applying the voltage thus converted to the bias gate 115 during the period for which the first switch 231 is turned on. Paying attention to AC components, components having 0.7 time to 0.8 time of the potential variation of the floating gate 108 are applied to the bias gate 115 as a feedback signal, so that the capacitance between the floating gate 108 and the bias gate 115 which originally serves as the parasitic capacitance of the floating gate 108 and causes the charge detection sensitivity to be lowered is equivalently reduced by 70 to 80%.

Each of the first switch 231 and the second switch 232 is composed of an N-type MOSFET as insulated gate FET, and the ON/OFF operation of each switch is controlled by supplying the driving pulse to the gate of each MOSFET from the outside of the element. The voltage value of the second DC voltage source 230 is set to 50 to 80V, and a voltage of 50 to 80V is applied to each terminal of the N-type MOSFET constituting the second switch 232 and the bias gate side terminal of the N-type MOSFET constituting the first switch, so that high-voltage MOSFETs which are usable with withstanding the above voltage are used as the N-type MOSFETs constituting the first switch 231 and the second switch 232.

When each of the first and second switches 231 and 232 is designed in an off-chip style unlike the above embodiment, new parts are required for these switches 231 and 232, however, the high-voltage MOSFETs are not needed to be installed in the device.

FIG. 9 is a timing chart showing the driving pulse for driving the device of this embodiment. The driving pulses ΦA, ΦB, ΦR are applied to the terminals 101, 102, 103 of FIG. 8 respectively, and a reset drain voltage VRD which is a fixed voltage is applied to the reset drain 110.

During the floating gate reset period, the driving pulses ΦA, ΦB, ΦR are stopped, and the second switch 232 is turned on at the timing indicated by SW2 of FIG. 9, so that the voltage of the second DC voltage source 230 is applied to the bias gate 115. At this time, charge delivery occurs between the N-type buried channel 117 and floating gate 108 or between the floating gate 108 and bias gate 115, or between the N-type buried channel 117 and floating gate 108 and between the floating gate 108 and bias gate 115, so that the potential of the floating gate 108 can be converged to some voltage irrespective of the charge amount of the floating gate 108 before the floating gate reset period.

During the charge transfer period, the second switch 232 is turned off, and the first switch 231 is turned on at the timing indicated by SW1 of FIG. 9, so that the output voltage of the bias feedback circuit 220 is applied to the bias gate 115. Further, the pulse voltages of the driving pulses ΦA, ΦB, ΦR are applied. The driving pulses ΦA, ΦB are two-phase driving pulses, and the driving pulse ΦR is a pulse to reset the potential of the N-type buried channel 117 below the floating gate 108 to the reset drain voltage VRD.

In the driving operation of this embodiment, the respective driving pulses are set as follows. That is, the floating gate reset period which is defined by the on-period of the second switch 232 is set to 1 to 5 μsec, and the voltage value of the second DC voltage source 230 is set to 50 to 80V. All the voltage values of the driving pulses ΦA, ΦB, ΦR are set to 0V, and a voltage of 0V is applied to the N-type semiconductor substrate 112 and the P-type well 116.

The operation during the floating gate reset period is the same as the first embodiment, and during this period the potential of the floating gate 108 is converged to a fixed voltage value, so that the charges charged in the floating gate 108 are discharged. At the time when the floating gate reset period is finished, the bias gate 115 and the second DC voltage source 230 are disconnected from each other, and the reset of the floating gate 108 is completed.

The driving pulses ΦA, ΦB, ΦR in the charge transfer period are the same as the driving pulses shown in FIG. 7 in the first embodiment, and they are applied to the respective electrodes in the same manner as the first embodiment.

In the charge transfer period, the first switch 231 is turned on, and the output voltage of the bias feedback circuit 220 is applied to the bias gate 115. The voltage value of the first DC voltage source 221 is set to 0 to 5V. This voltage value is set to such a voltage value that the channel potential below the floating gate 108 is deeper than at least the channel potential below the output gate 119 so that the signal charge can be accumulated in the region of the N-type buried channel 117 below the floating gate 108 when the signal charge is transferred from the position below the electrode 107S to the position below the floating gate 108.

In the above embodiments described above, when the signal charge is transferred to the position below the floating gate 108, the voltage which is substantially proportional to the amount of the signal charge is induced at the floating gate 108 through the coupling capacitance between the transfer channel and the floating gate 108, and this potential variation is output as the output voltage through the buffer amplifier 104 to the outside. At this time, the signal charge is mixed with charges which have existed below the floating gate 108 during the transfer of the signal charge. Therefore, this charge detection method is a destructive detection method. However, if a transfer electrode is provided at the right side of the floating gate 108 in FIG. 6 or 8 so as to be adjacent to the floating gate 108 as if the reset gate is replaced by the transfer electrode to perfectly transfer the signal charges accumulated below the floating gate 108 to the region below the transfer electrode provided, a non-destructive detection method could be achieved.

As described above, according to the present invention, when the floating gate is charged by some cause during the manufacturing process of the floating gate type-charge detector having the bias gate above the floating gate or during use of the detector after it is manufactured, the charge can be removed. As a result, there can be solved the disadvantages of the failure of the charge detection and the reduction in conversion efficiency in the charge detection which occur when the charge amount is excessive. Further, even when the charge amount is dispersed over plural charge detectors manufactured although the charge amount is not excessive, it is unnecessary to correct this dispersion, and thus the number of parts of a driving device needed for the correction of the dispersion can be reduced.

Viewing from another aspect, according to the present invention, the potential of the floating gate can be set to some voltage without adding any preset transistor. The present invention needs no preset transistor and thus increase of the parasitic capacitance due to addition of the preset transistor can be excluded. Accordingly, the charge detection capacitance can be reduced by about 20% as compared with the conventional charge detector added with the preset transistor, and this is equivalent to the enhancement of the charge detection sensitivity by about 25%.

What is claimed is:

1. A charge transfer device provided with a charge detection portion which comprises:

a floating gate, means for detecting the potential variation of said floating gate, and means for injecting electrons through an insulating film into said floating gate or means for extracting electrons through an insulating film from said floating gate.

2. A charge transfer device provided with a charge detection portion which comprises:

a floating gate;

means for detecting the potential variation of said floating gate;

a bias gate which covers at least a part of said floating gate; and voltage applying means for applying a first voltage to said bias gate to make said floating gate hold the DC bias voltage as an offset level, and applying a second voltage to said bias gate to inject electrons through an insulating film into said floating gate or extract electrons through an insulating film from said floating gate.

3. A charge transfer device provided with a charge detection portion which comprises:

a floating gate;

a buffer amplifier for detecting the potential variation of said floating gate;

a bias gate which covers at least a part of said floating gate;

a bias feedback circuit for adding the AC component output of said buffer amplifier to a first DC voltage and applying the addition result to said bias gate for a charge detection period;

voltage applying means for applying a second DC voltage to said bias gate to inject electrons through an insulating film into said floating gate or extract electrons through an insulating film from said floating gate in a floating gate reset period which is set to be out of said charge detection period.

4. The charge transfer device as claimed in claim 1, wherein the film thickness of an interlayer film between a semiconductor substrate provided with said charge detection portion and said floating gate is set to be smaller than the film thickness of an interlayer film between said semiconductor substrate and a transfer electrode of a charge transfer element for transferring charge to said charge detection portion.

5. The charge transfer device as claimed in claim 3, wherein said bias feedback circuit comprises a capacitance element and a resistance element which are series-connected to each other between the output terminal of said buffer amplifier and a DC voltage source, and there are provided a first switch for applying the voltage of the connection point between said capacitance element and said resistance element to said bias gate during said charge detection period and a second switch as said voltage applying means for applying said second DC voltage to said bias gate during said floating gate reset period.

6. The charge transfer device as claimed in claim 5, wherein said first and second switches are provided on a semiconductor substrate provided with said charge detection portion in a on-chip style.

7. The charge transfer device as claimed in claim 5, wherein said first and second switches are provided in an off-chip style away from a semiconductor substrate provided with said charge detection portion.

8. The charge transfer device as claimed in claim 6, wherein said first switch is composed of an insulated gate FET provided between said bias gate and the connection point between said capacitance element and resistance element, and said second switch is composed of an insulated gate FET provided between a DC voltage source for applying said second DC voltage and said bias gate.

* * * * *